US008301681B1

(12) United States Patent
Lee et al.

(10) Patent No.: US 8,301,681 B1
(45) Date of Patent: Oct. 30, 2012

(54) SPECIALIZED PROCESSING BLOCK FOR PROGRAMMABLE LOGIC DEVICE

(75) Inventors: Kwan Yee Martin Lee, Hayward, CA (US); Martin Langhammer, Salisbury (GB); Triet M. Nguyen, San Jose, CA (US); Yi-Wen Lin, Pasadena, CA (US)

(73) Assignee: Altera Corporation, San Jose, CA (US)

( * ) Notice: Subject to any disclaimer, the term of this patent is extended or adjusted under 35 U.S.C. 154(b) by 1406 days.

(21) Appl. No.: 11/447,474

(22) Filed: Jun. 5, 2006

Related U.S. Application Data

(60) Provisional application No. 60/771,988, filed on Feb. 9, 2006.

(51) Int. Cl.
G06F 7/38 (2006.01)
G06F 7/00 (2006.01)
G06F 15/00 (2006.01)

(52) U.S. Cl. .................. 708/523; 708/525; 708/495
(58) Field of Classification Search ........... 708/620–656
See application file for complete search history.

(56) References Cited

U.S. PATENT DOCUMENTS

| | | |
|---|---|---|
| 3,473,160 A | 10/1969 | Wahlstrom |
| 3,800,130 A | 3/1974 | Martinson et al. |
| 3,814,924 A | 6/1974 | Tate |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,616,330 A | 10/1986 | Betz |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,736,335 A | 4/1988 | Barkan |
| 4,754,421 A | 6/1988 | Bosshart |
| 4,791,590 A | 12/1988 | Ku et al. |
| 4,799,004 A | 1/1989 | Mori |
| 4,823,295 A | 4/1989 | Mader |

(Continued)

FOREIGN PATENT DOCUMENTS
EP 0 158 430 10/1985

(Continued)

OTHER PUBLICATIONS

Altera Corporation, "Stratix II Device Handbook, Section IV—Digital Signal Processing (DSP)," v1.1, Jul. 2004.*

(Continued)

*Primary Examiner* — Chuong D Ngo
*Assistant Examiner* — Matthew Sandifer
(74) *Attorney, Agent, or Firm* — Ropes & Gray LLP; Jeffrey H. Ingerman

(57) ABSTRACT

A specialized processing block for a programmable logic device includes circuitry for performing multiplications and sums thereof, as well as circuitry for performing floating point operations. The floating point circuitry preferably includes rounding and normalization circuitry. To perform mantissa multiplications, the floating point circuitry preferably relies on the aforementioned multipliers of the specialized processing block.

11 Claims, 8 Drawing Sheets

U.S. PATENT DOCUMENTS

| | | | |
|---|---|---|---|
| 4,839,847 A | 6/1989 | Laprade | |
| 4,871,930 A | 10/1989 | Wong et al. | |
| 4,912,345 A | 3/1990 | Steele et al. | |
| 4,918,637 A | 4/1990 | Morton | |
| 4,967,160 A | 10/1990 | Quievy et al. | |
| 4,982,354 A | 1/1991 | Takeuchi et al. | |
| 4,991,010 A | 2/1991 | Hailey et al. | |
| 4,994,997 A | 2/1991 | Martin et al. | |
| 5,073,863 A | 12/1991 | Zhang | |
| 5,081,604 A | 1/1992 | Tanaka | |
| 5,122,685 A | 6/1992 | Chan et al. | |
| 5,128,559 A | 7/1992 | Steele | |
| 5,175,702 A | 12/1992 | Beraud et al. | |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,339,263 A | 8/1994 | White | |
| 5,349,250 A | 9/1994 | New | |
| 5,357,152 A | 10/1994 | Jennings, III et al. | |
| 5,371,422 A | 12/1994 | Patel et al. | |
| 5,375,079 A | 12/1994 | Uramoto et al. | |
| 5,381,357 A | 1/1995 | Wedgwood et al. | |
| 5,404,324 A | 4/1995 | Colon-Bonet | |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,812 A | 3/1996 | Saishi et al. | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,541,864 A | 7/1996 | Van Bavel et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,631,848 A | 5/1997 | Laczko et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,519 A | 7/1997 | Yatim | |
| 5,644,522 A | 7/1997 | Moyse et al. | |
| 5,646,545 A | 7/1997 | Trimberger et al. | |
| 5,646,875 A | 7/1997 | Taborn et al. | |
| 5,648,732 A | 7/1997 | Duncan | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | |
| 5,696,708 A | 12/1997 | Leung | |
| 5,729,495 A | 3/1998 | Madurawe | |
| 5,740,404 A | 4/1998 | Baji | |
| 5,744,980 A | 4/1998 | McGowan et al. | |
| 5,744,991 A | 4/1998 | Jefferson et al. | |
| 5,754,459 A | 5/1998 | Telikepalli | |
| 5,761,483 A | 6/1998 | Trimberger | |
| 5,764,555 A | 6/1998 | McPherson et al. | |
| 5,768,613 A | 6/1998 | Asghar | |
| 5,771,186 A | 6/1998 | Kodali et al. | |
| 5,777,912 A | 7/1998 | Leung et al. | |
| 5,784,636 A | 7/1998 | Rupp | |
| 5,790,446 A | 8/1998 | Yu et al. | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,808,926 A | 9/1998 | Gorshtein et al. | |
| 5,812,479 A | 9/1998 | Cliff et al. | |
| 5,812,562 A | 9/1998 | Baeg | |
| 5,815,422 A | 9/1998 | Dockser | |
| 5,821,776 A | 10/1998 | McGowan | |
| 5,825,202 A | 10/1998 | Tavana et al. | |
| 5,838,165 A | 11/1998 | Chatter | |
| 5,841,684 A | 11/1998 | Dockser | |
| 5,847,579 A | 12/1998 | Trimberger | |
| 5,847,978 A | 12/1998 | Ogura et al. | |
| 5,847,981 A | 12/1998 | Kelley et al. | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | |
| 5,878,250 A | 3/1999 | LeBlanc | |
| 5,880,981 A | 3/1999 | Kojima et al. | |
| 5,892,962 A | 4/1999 | Cloutier | |
| 5,894,228 A | 4/1999 | Reddy et al. | |
| 5,898,602 A | 4/1999 | Rothman et al. | |
| 5,931,898 A | 8/1999 | Khoury | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,968,196 A | 10/1999 | Ramamurthy et al. | |
| 5,970,254 A | 10/1999 | Cooke et al. | |
| 5,978,260 A | 11/1999 | Trimberger et al. | |
| 5,982,195 A | 11/1999 | Cliff et al. | |
| 5,986,465 A | 11/1999 | Mendel | |
| 5,991,788 A | 11/1999 | Mintzer | |
| 5,991,898 A | 11/1999 | Rajski et al. | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,006,321 A | 12/1999 | Abbott | |
| 6,009,451 A | 12/1999 | Burns | |
| 6,018,755 A | 1/2000 | Gonikberg et al. | |
| 6,020,759 A | 2/2000 | Heile | |
| 6,021,423 A | 2/2000 | Nag et al. | |
| 6,029,187 A | 2/2000 | Verbauwhede | |
| 6,031,763 A | 2/2000 | Sansbury | |
| 6,041,339 A | 3/2000 | Yu et al. | |
| 6,041,340 A | 3/2000 | Mintzer | |
| 6,052,327 A | 4/2000 | Reddy et al. | |
| 6,052,755 A | 4/2000 | Terrill et al. | |
| 6,055,555 A | 4/2000 | Boswell et al. | |
| 6,064,614 A | 5/2000 | Khoury | |
| 6,065,131 A | 5/2000 | Andrews et al. | |
| 6,066,960 A | 5/2000 | Pedersen | |
| 6,069,487 A | 5/2000 | Lane et al. | |
| 6,072,994 A | 6/2000 | Phillips et al. | |
| 6,073,154 A | 6/2000 | Dick | |
| 6,075,381 A | 6/2000 | LaBerge | |
| 6,084,429 A | 7/2000 | Trimberger | |
| 6,085,317 A | 7/2000 | Smith | |
| 6,091,261 A | 7/2000 | De Lange | |
| 6,091,765 A | 7/2000 | Pietzold, III et al. | |
| 6,094,726 A | 7/2000 | Gonion et al. | |
| 6,097,988 A | 8/2000 | Tobias | |
| 6,098,163 A | 8/2000 | Guttag et al. | |
| 6,107,820 A | 8/2000 | Jefferson et al. | |
| 6,107,821 A | 8/2000 | Kelem et al. | |

| | | | |
|---|---|---|---|
| 6,107,824 A | 8/2000 | Reddy et al. | |
| 6,130,554 A | 10/2000 | Kolze et al. | |
| 6,140,839 A | 10/2000 | Kaviani et al. | |
| 6,144,980 A | 11/2000 | Oberman | |
| 6,154,049 A | 11/2000 | New | |
| 6,157,210 A | 12/2000 | Zaveri et al. | |
| 6,163,788 A | 12/2000 | Chen et al. | |
| 6,167,415 A | 12/2000 | Fischer et al. | |
| 6,175,849 B1 | 1/2001 | Smith | |
| 6,215,326 B1 | 4/2001 | Jefferson et al. | |
| 6,226,735 B1 | 5/2001 | Mirsky | |
| 6,242,947 B1 | 6/2001 | Trimberger | |
| 6,243,729 B1 | 6/2001 | Staszewski | |
| 6,246,258 B1 | 6/2001 | Lesea | |
| 6,260,053 B1 | 7/2001 | Maulik et al. | |
| 6,279,021 B1 | 8/2001 | Takano et al. | |
| 6,286,024 B1 | 9/2001 | Yano et al. | |
| 6,314,442 B1 | 11/2001 | Suzuki | |
| 6,314,551 B1 | 11/2001 | Borland | |
| 6,321,246 B1 | 11/2001 | Page et al. | |
| 6,323,680 B1 | 11/2001 | Pedersen et al. | |
| 6,327,605 B2 | 12/2001 | Arakawa et al. | |
| 6,351,142 B1 | 2/2002 | Abbott | |
| 6,353,843 B1 | 3/2002 | Chehrazi et al. | |
| 6,359,468 B1 | 3/2002 | Park et al. | |
| 6,360,240 B1 | 3/2002 | Takano et al. | |
| 6,362,650 B1 | 3/2002 | New et al. | |
| 6,366,944 B1 | 4/2002 | Hossain et al. | |
| 6,367,003 B1 | 4/2002 | Davis | |
| 6,369,610 B1 | 4/2002 | Cheung et al. | |
| 6,377,970 B1 | 4/2002 | Abdallah et al. | |
| 6,407,576 B1 | 6/2002 | Ngai et al. | |
| 6,407,694 B1 | 6/2002 | Cox et al. | |
| 6,427,157 B1 | 7/2002 | Webb | |
| 6,434,587 B1 | 8/2002 | Liao et al. | |
| 6,438,569 B1 | 8/2002 | Abbott | |
| 6,438,570 B1 * | 8/2002 | Miller | 708/625 |
| 6,446,107 B1 | 9/2002 | Knowles | |
| 6,453,382 B1 | 9/2002 | Heile | |
| 6,467,017 B1 | 10/2002 | Ngai et al. | |
| 6,480,980 B2 | 11/2002 | Koe | |
| 6,483,343 B1 | 11/2002 | Faith et al. | |
| 6,487,575 B1 | 11/2002 | Oberman | |
| 6,523,055 B1 | 2/2003 | Yu et al. | |
| 6,523,057 B1 | 2/2003 | Savo et al. | |
| 6,531,888 B2 | 3/2003 | Abbott | |
| 6,538,470 B1 | 3/2003 | Langhammer et al. | |
| 6,542,000 B1 | 4/2003 | Black et al. | |
| 6,556,044 B2 | 4/2003 | Langhammer et al. | |
| 6,557,092 B1 | 4/2003 | Callen | |
| 6,571,268 B1 | 5/2003 | Giacalone et al. | |
| 6,573,749 B2 | 6/2003 | New et al. | |
| 6,574,762 B1 | 6/2003 | Karimi et al. | |
| 6,591,283 B1 | 7/2003 | Conway et al. | |
| 6,591,357 B2 | 7/2003 | Mirsky | |
| 6,600,495 B1 | 7/2003 | Boland et al. | |
| 6,600,788 B1 | 7/2003 | Dick et al. | |
| 6,628,140 B2 | 9/2003 | Langhammer et al. | |
| 6,687,722 B1 | 2/2004 | Larsson et al. | |
| 6,692,534 B1 | 2/2004 | Wang et al. | |
| 6,700,581 B2 | 3/2004 | Baldwin et al. | |
| 6,725,441 B1 | 4/2004 | Keller et al. | |
| 6,728,901 B1 | 4/2004 | Rajski et al. | |
| 6,731,133 B1 | 5/2004 | Feng et al. | |
| 6,732,134 B1 | 5/2004 | Rosenberg et al. | |
| 6,744,278 B1 | 6/2004 | Liu et al. | |
| 6,745,254 B2 | 6/2004 | Boggs et al. | |
| 6,763,367 B2 | 7/2004 | Kwon et al. | |
| 6,771,094 B1 * | 8/2004 | Langhammer et al. | 708/625 |
| 6,774,669 B1 | 8/2004 | Liu et al. | |
| 6,781,408 B1 | 8/2004 | Langhammer | |
| 6,781,410 B2 | 8/2004 | Pani et al. | |
| 6,788,104 B2 | 9/2004 | Singh et al. | |
| 6,801,924 B1 | 10/2004 | Green et al. | |
| 6,806,733 B1 | 10/2004 | Pan et al. | |
| 6,836,839 B2 | 12/2004 | Master et al. | |
| 6,874,079 B2 | 3/2005 | Hogenauer | |
| 6,889,238 B2 | 5/2005 | Johnson | |
| 6,904,471 B2 | 6/2005 | Boggs et al. | |
| 6,924,663 B2 | 8/2005 | Masui et al. | |
| 6,963,890 B2 | 11/2005 | Dutta et al. | |
| 6,971,083 B1 | 11/2005 | Farrugia et al. | |
| 6,978,287 B1 | 12/2005 | Langhammer | |
| 6,983,300 B2 | 1/2006 | Ferroussat | |
| 7,020,673 B2 | 3/2006 | Ozawa | |
| 7,047,272 B2 | 5/2006 | Giacalone et al. | |
| 7,062,526 B1 | 6/2006 | Hoyle | |
| 7,093,204 B2 | 8/2006 | Oktem et al. | |
| 7,107,305 B2 | 9/2006 | Deng et al. | |
| 7,113,969 B1 | 9/2006 | Green et al. | |
| 7,181,484 B2 | 2/2007 | Stribaek et al. | |
| 7,313,585 B2 | 12/2007 | Winterrowd | |
| 7,395,298 B2 | 7/2008 | Debes et al. | |
| 7,401,109 B2 | 7/2008 | Koc et al. | |
| 7,409,417 B2 | 8/2008 | Lou | |
| 7,415,542 B2 | 8/2008 | Hennedy et al. | |
| 7,421,465 B1 * | 9/2008 | Rarick et al. | 708/490 |
| 7,428,565 B2 | 9/2008 | Fujimori | |
| 7,428,566 B2 * | 9/2008 | Siu et al. | 708/501 |
| 7,430,578 B2 | 9/2008 | Debes et al. | |
| 7,430,656 B2 | 9/2008 | Sperber et al. | |
| 7,447,310 B2 | 11/2008 | Koc et al. | |
| 7,472,155 B2 * | 12/2008 | Simkins et al. | 708/523 |
| 7,508,936 B2 | 3/2009 | Eberle et al. | |
| 7,536,430 B2 | 5/2009 | Guevokian et al. | |
| 7,567,997 B2 * | 7/2009 | Simkins et al. | 708/523 |
| 7,590,676 B1 * | 9/2009 | Langhammer | 708/319 |
| 7,646,430 B2 | 1/2010 | Brown Elliott et al. | |
| 7,668,896 B2 | 2/2010 | Lutz et al. | |
| 7,719,446 B2 | 5/2010 | Rosenthal et al. | |
| 7,769,797 B2 | 8/2010 | Cho et al. | |
| 7,822,799 B1 | 10/2010 | Langhammer et al. | |
| 7,930,335 B2 | 4/2011 | Gura | |
| 7,930,336 B2 | 4/2011 | Langhammer | |
| 2001/0023425 A1 | 9/2001 | Oberman et al. | |
| 2001/0029515 A1 | 10/2001 | Mirsky | |
| 2001/0037352 A1 | 11/2001 | Hong | |
| 2002/0002573 A1 * | 1/2002 | Landers et al. | 708/501 |
| 2002/0038324 A1 | 3/2002 | Page et al. | |
| 2002/0049798 A1 | 4/2002 | Wang et al. | |
| 2002/0078114 A1 | 6/2002 | Wang et al. | |
| 2002/0089348 A1 | 7/2002 | Langhammer | |
| 2002/0116434 A1 | 8/2002 | Nancekievill | |
| 2003/0088757 A1 | 5/2003 | Lindner et al. | |
| 2004/0064770 A1 | 4/2004 | Xin | |
| 2004/0083412 A1 | 4/2004 | Corbin et al. | |
| 2004/0103133 A1 | 5/2004 | Gurney | |
| 2004/0122882 A1 | 6/2004 | Zakharov et al. | |
| 2004/0148321 A1 | 7/2004 | Guevorkian et al. | |
| 2004/0172439 A1 | 9/2004 | Lin | |
| 2004/0178818 A1 | 9/2004 | Crotty et al. | |
| 2004/0193981 A1 | 9/2004 | Clark et al. | |
| 2004/0267857 A1 | 12/2004 | Abel et al. | |
| 2004/0267863 A1 | 12/2004 | Bhushan et al. | |
| 2005/0038842 A1 | 2/2005 | Stoye | |
| 2005/0144213 A1 * | 6/2005 | Simkins et al. | 708/490 |
| 2005/0144215 A1 | 6/2005 | Simkins et al. | |
| 2005/0144216 A1 * | 6/2005 | Simkins et al. | 708/620 |
| 2005/0166038 A1 | 7/2005 | Wang et al. | |
| 2005/0187997 A1 | 8/2005 | Zheng et al. | |
| 2005/0187999 A1 | 8/2005 | Zheng et al. | |
| 2005/0262175 A1 | 11/2005 | Iino et al. | |
| 2006/0020655 A1 | 1/2006 | Lin | |
| 2007/0083585 A1 | 4/2007 | St. Denis et al. | |
| 2007/0185951 A1 | 8/2007 | Lee et al. | |
| 2007/0185952 A1 | 8/2007 | Langhammer et al. | |
| 2007/0241773 A1 | 10/2007 | Hutchings et al. | |
| 2008/0133627 A1 | 6/2008 | Langhammer et al. | |
| 2008/0183783 A1 | 7/2008 | Tubbs | |
| 2009/0172052 A1 | 7/2009 | DeLaquil et al. | |
| 2009/0187615 A1 | 7/2009 | Abe et al. | |
| 2009/0300088 A1 | 12/2009 | Michaels et al. | |
| 2010/0098189 A1 | 4/2010 | Oketani | |

FOREIGN PATENT DOCUMENTS

| | | |
|---|---|---|
| EP | 0 326 415 | 8/1989 |
| EP | 0 380 456 | 8/1990 |
| EP | 0 411 491 | 2/1991 |

| | | |
|---|---|---|
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 049 025 | 11/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-332036 | 11/1992 |
| JP | 5-134851 | 6/1993 |
| JP | 06-187129 | 7/1994 |
| JP | 7-135447 | 5/1995 |
| JP | 11-296345 | 10/1999 |
| JP | 2000-259394 | 9/2000 |
| JP | 2002-108606 | 4/2002 |
| JP | 2002-251281 | 9/2002 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO 2005/066832 | 7/2005 |
| WO | WO-2005/101190 | 10/2005 |

OTHER PUBLICATIONS

G. Govindu, R. Scrofano, and V. K. Prasanna, "A Library of Parameterizable Floating-Point Cores for FPGAs and Their Application to Scientific Computing," In Proc. Intl Conf. Eng. Reconfigurable Systems and Algorithms (ERSA'05), Jun. 2005.*
G. Govindu, L. Zhuo, S. Choi, and V. Prasanna, "Analysis of High-performance Floating-point Arithmetic on FPGAs," in Proceedings of the 18th International Parallel and Distributed Processing Symposium (IPDPS'04), pp. 149-156, Apr. 2004.*
T. Vladimirova, D. Eamey, S. Keller and Prof Sir M. Sweeting, "Floating-Point Mathematical Co-Processor for a Single-Chip On-Board Computer", MAPLD'03 Conference, D5, Sep. 2003.*
Amos, D., "PLD architectures match DSP algorithms," *Electronic Product Design*, vol. 17, No. 7, Jul. 1996, pp. 30, 32.
Analog Devices, Inc., The Applications Engineering Staff of Analog Devices, DSP Division, *Digital Signal Processing Applications Using the ADSP-2100 Family* (edited by Amy Mar), 1990, pp. 141-192).
Andrejas, J., et al., "Reusable DSP functions in FPGAs" *Field-Programmable Logic and Applications. Roadmap to Reconfigurable Computing. 10th International Conference, FPL 2000. Proceedings* (Lecture Notes in Computer Science vol. 1896), Aug. 27-30, 2000, pp. 456-461.
Aoki, T., "Signed-weight arithmetic and its application to a field-programmable digital filter architecture," *IEICE Transactions on Electronics*, 1999, vol. E82C, No. 9, Sep. 1999, pp. 1687-1698.
Ashour, M.A., et al., "An FPGA implementation guide for some different types of serial-parallel multiplier-structures," *Microelectronics Journal*, vol. 31, No. 3, 2000, pp. 161-168.
Berg. B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.
Chhabra, A. et al., Texas Instruments Inc., "A Block Floating Point Implementation on the TMS320C54x DSP", Application Report SPRA610, Dec. 1999, pp. 1-10.
Colet, p., "When DSPs and FPGAs meet: Optimizing image processing architectures," *Advanced Imaging*, vol. 12, No. 9, Sep. 1997, pp. 14, 16, 18.
Crookes, D., et al., "Design and implementation of a high level programming environment for FPGA-based image processing," *IEE Proceedings—Vision, Image and Signal Processing*, vol. 147, No. 4, Aug. 2000, pp. 377-384.
Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-288.
Dick, C., et al., "Configurable logic for digital communications: some signal processing perspectives," *IEEE Communications Magazine*, vol. 37, No. 8, Aug. 1999, pp. 107-111.
Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-445.
Gaffar, A.A., et al., "Floating-Point Bitwidth Analysis via Automatic Differentiation," *IEEE Conference on Field Programmable Technology*, Hong Kong, Dec. 2002.
Guccione, S.A.,"Run-time Reconfiguration at Xilinx," *Parallel and distributed processing: 15 IPDPS 2000 workshops*, Rolim, J., ed., May 1-5, 2000, p. 873.
Hauck, S., "The Future of Reconfigurable Systems," Keynote Address, *5th Canadian Conference on Field Programmable Devices*, Jun. 1998, http://www.ee.washington.edu/people/faculty/hauck/publications/ReconfigFuture.PDF.
Heysters, P.M., et al., "Mapping of DSP algorithms on field programmable function arrays," *Field-Programmable Logic and Applications. Roadmap to Reconfigurable Computing. 10th International Conference, FPL 2000. Proceedings* (Lecture Notes in Computer Science vol. 1896), Aug. 27-30, 2000, pp. 400-411.
Huang, J., et al., "Simulated Performance of 1000BASE-T Receiver with Different Analog Front End Designs," *Proceedings of the 35th ASILOMAR Conference on Signals, Systems, and Computers*, Nov. 4-7, 2001.
Lattice Semiconductor Corp, *ORCA® FPGA Express™ Interface Manual: ispLEVER® Version 3.0*, 2002.
Lucent Technologies, Microelectronics Group,"Implementing and Optimizing Multipliers in ORCA™ FPGAs,", Application Note. AP97-008FGPA, Feb. 1997.
"Implementing Multipliers in FLEX 10K EABs", *Altera*, Mar. 1996.
"Implementing Logic with the Embedded Array in FLEX 10K Devices", *Altera*, May 2001, ver. 2.1.
Jinghua Li, "Design a pocket multi-bit multiplier in FPGA," *1996 2nd International Conference on ASIC Proceedings* (IEEE Cat. No. 96TH8140), Oct. 21-24, 1996, pp. 275-279.
Jones, G., "Field-programmable digital signal conditioning," *Electronic Product Design*, vol. 21, No. 6, Jun. 2000, pp. C36-C38.
Kiefer, R., et al., "Performance comparison of software/FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.
Kramberger, I., "DSP acceleration using a reconfigurable FPGA," *ISIE '99. Proceedings of the IEEE International Symposium on Industrial Electronics* (Cat. No. 99TH8465), vol. 3, Jul. 12-16, 1999, pp. 1522-1525.
Langhammer, M., "How to implement DSP in programmable logic," *Elettronica Oggi* No. 266, Dec. 1998, pp. 113-115.
Langhammer, M., "Implementing a DSP in Programmable Logic," *Online EE Times*, May 1998, http://www.eetimes.com/editorial/1998/coverstory9805.html.
Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," *First International Conference on 3G Mobile Communication Technologies* (Conf. Publ. No. 471), Mar. 27-29, 2000, pp. 306-310.

Miller, n. L., et al., "Reconfigurable integrated circuit for high performance computer arithmetic," *Proceedings of the 1998 IEEE Colloquium on Evolvable Hardware Systems (Digest)*, No. 233, 1998, pp. 2/1-2/4.

Mintzer, L, "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9) vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A, et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Embedded digital signal processor (DSP) modules in programmable logic devices (PLDs)," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.uniontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Altera Corporation, "Digital Signal Processing (DSP)," *Stratix Device Handbook*, vol. 2, Chapter 6 and Chapter 7, v1.1 (Sep. 2004).

Altera Corporation, "DSP Blocks in Stratix II and Stratix II GX Devices," *Stratix II Device Handbook*, vol. 2, Chapter 6, v4.0 (Oct. 2005).

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.

Xilinx Inc., "XtremeDSP Design Considerations User Guide," v 1.2, Feb. 4, 2005.

Altera Corporation, "FIR Compiler: MegaCore® Function User Guide," version 3.3.0, rev. 1, pp. 3 11 through 3 15 (Oct. 2005).

Altera Corporation, "Stratix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Haynes, S.D., et al., "Configurable multiplier blocks for embedding in FPGAs," *Electronics Letters*, vol. 34, No. 7, pp. 638-639 (Apr. 2, 1998).

Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.

Nakasato, N., et al., "Acceleration of Hydrosynamical Simulations using a FPGA board" *The Institute of Electronics Information and Communication Technical Report CPSY2005-47*, vol. 105, No. 515, Jan. 17, 2006.

Osana, Y., et al., "Hardware-resource Utilization Analysis on an FPGA-Based Biochemical Simulator ReCSiP", *The Institute of Electronics Information and Communication Technical Report CPSY2005-63*, vol. 105, No. 516, Jan. 18, 2006.

Altera Corporation, "Advanced Synthesis Cookbook: A Design Guide for Stratix II, Stratix III and Stratix IV Devices," Document Version 3.0, 112 pgs., May 2008.

deDinechin, F. et al., "Large multipliers with less DSP blocks," retrieved from http://hal-ens-lyon.archives-ouvertes.fr/ensl-00356421/en/, 9 pgs., available online Jan. 2009.

Wajih, E.-H.Y. et al., "Efficient Hardware Architecture of Recursive Karatsuba-Ofman Multiplier," *3rd International Conference on Design and Technology of Integrated Systems in Nanoscale Era*, 6 pgs., Mar. 2008.

Zhou, G. et al., "Efficient and High-Throughput Implementations of AES-GCM on FPGAs," *International Conference on Field-Programmable Technology*, 8 pgs., Dec. 2007.

Martinson, L. et al., "Digital Matched Filtering with Pipelined Floating Point Fast Fourier Transforms (FFT's)," *IEEE Transactions on Acoustics, Speech, and Signal Processing*, vol. ASSP-23, No. 2, pp. 222-234, Apr. 1975.

Farooqui, A., et al., "General Data-Path Organization of a MAC unit for VLSI Implementation of DSP Processors," ISCAS '98, Part 2, May 31, 1998-Jun. 3, 1998, pp. 260-263.

* cited by examiner

SPECIALIZED PROCESSING BLOCK FOR PROGRAMMABLE LOGIC DEVICE

CROSS REFERENCE TO RELATED APPLICATION

This claims the benefit of commonly-assigned U.S. Provisional Patent Application No. 60/771,988, filed Feb. 9, 2006, which is hereby incorporated by reference herein in its entirety.

BACKGROUND OF THE INVENTION

This invention relates to programmable logic devices (PLDs), and, more particularly, to specialized processing blocks which may be included in such devices.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, a PLD sold by Altera Corporation, of San Jose, Calif., under the name STRATIX® II includes DSP blocks, each of which includes four 18-by-18 multipliers. Each of those DSP blocks also includes adders and registers, as well as programmable connectors (e.g., multiplexers) that allow the various components to be configured in different ways. In each such block, the multipliers can be configured not only as four individual 18-by-18 multipliers, but also as four smaller multipliers, or as one larger (36-by-36) multiplier. In addition, one 18-by-18 complex multiplication (which decomposes into two 18-by-18 multiplication operations for each of the real and imaginary parts) can be performed. In order to support four 18-by-18 multiplication operations, the block has 4×(18+18)=144 inputs. Similarly, the output of an 18-by-18 multiplication is 36 bits wide, so to support the output of four such multiplication operations, the block also has 36×4=144 outputs.

The arithmetic operations to be performed by a PLD frequently are floating point operations. However, although DSP blocks are well-adapted to perform arithmetic operations, particularly multiplication, known DSP blocks, including that provided in the aforementioned STRATIX® II PLD, have not supported floating point operation without resort to the programmable logic of the PLD for at least a portion of the operation.

It would be desirable to be able to provide improved floating point operation capabilities in a PLD.

SUMMARY OF THE INVENTION

The present invention relates to specialized processing blocks for PLDs wherein the specialized processing blocks have improved floating point operation capabilities.

The specialized processing block with which the invention may be used preferably includes a plurality of fundamental processing units instead of discrete multipliers. Each fundamental processing unit preferably includes the equivalent of at least two multipliers and logic to sum the partial products of all of the at least two multipliers. As a result, the sums of the all of the multiplications are computed in a single step, rather than summing the partial products of each multiplier to form individual products and then summing those products. Such a fundamental processing unit can be constructed with an area smaller than that of the individual multipliers and adders. If a single multiplication is required to be performed, one of the multipliers in the fundamental processing unit is used, while the inputs to the other(s) are zeroed out. Nevertheless, because the provision of the fundamental processing unit reduces the area of the specialized processing block, efficiency is improved.

In a preferred embodiment, the fundamental processing unit includes the equivalent of two 18-by-18 multipliers and one adder so that it can output the sum of the two multiplication operations. While each of the 18-by-18 multipliers can be configured for a smaller multiplication operation (e.g., 9-by-9 or 12-by-12), the integrated nature of the fundamental processing unit means that the individual multiplier outputs are not accessible. Only the sum is available for use by the remainder of the specialized processing block. Therefore, to obtain the result of a single non-complex multiplication that is 18 bits-by-18 bits or smaller, an entire fundamental processing unit must be used. The second multiplier, which cannot be disengaged, simply has its inputs zeroed.

The specialized processing block with which the invention may be used preferably also has one or more additional adders for additional processing of the output of the fundamental processing unit, as well as optional pipeline registers and a flexible output stage. Therefore the specialized processing block preferably can be configured for various forms of filtering and other digital signal processing operations. In addition, the specialized processing block preferably also has the capability to feed back at least one of its outputs as an input, which is useful in adaptive filtering operations, and to chain both inputs and outputs to additional specialized processing blocks.

However, regardless of the particular arrangement of multipliers, adders and other components in the specialized processing block, the specialized processing block according to the invention preferably includes floating point circuitry to allow the specialized processing block to perform floating point operations without having to rely on programmable logic outside the specialized processing block. The floating point circuitry preferably includes rounding and normalization circuitry. To perform mantissa multiplications, the floating point circuitry preferably relies on the aforementioned multipliers of the specialized processing block.

Therefore, in accordance with the present invention, there is provided a specialized processing block for a programmable logic device. The specialized processing block includes arithmetic circuitry for providing products of inputs and sums of those products to output a result. The arithmetic circuitry includes floating point circuitry for carrying out floating point operations.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
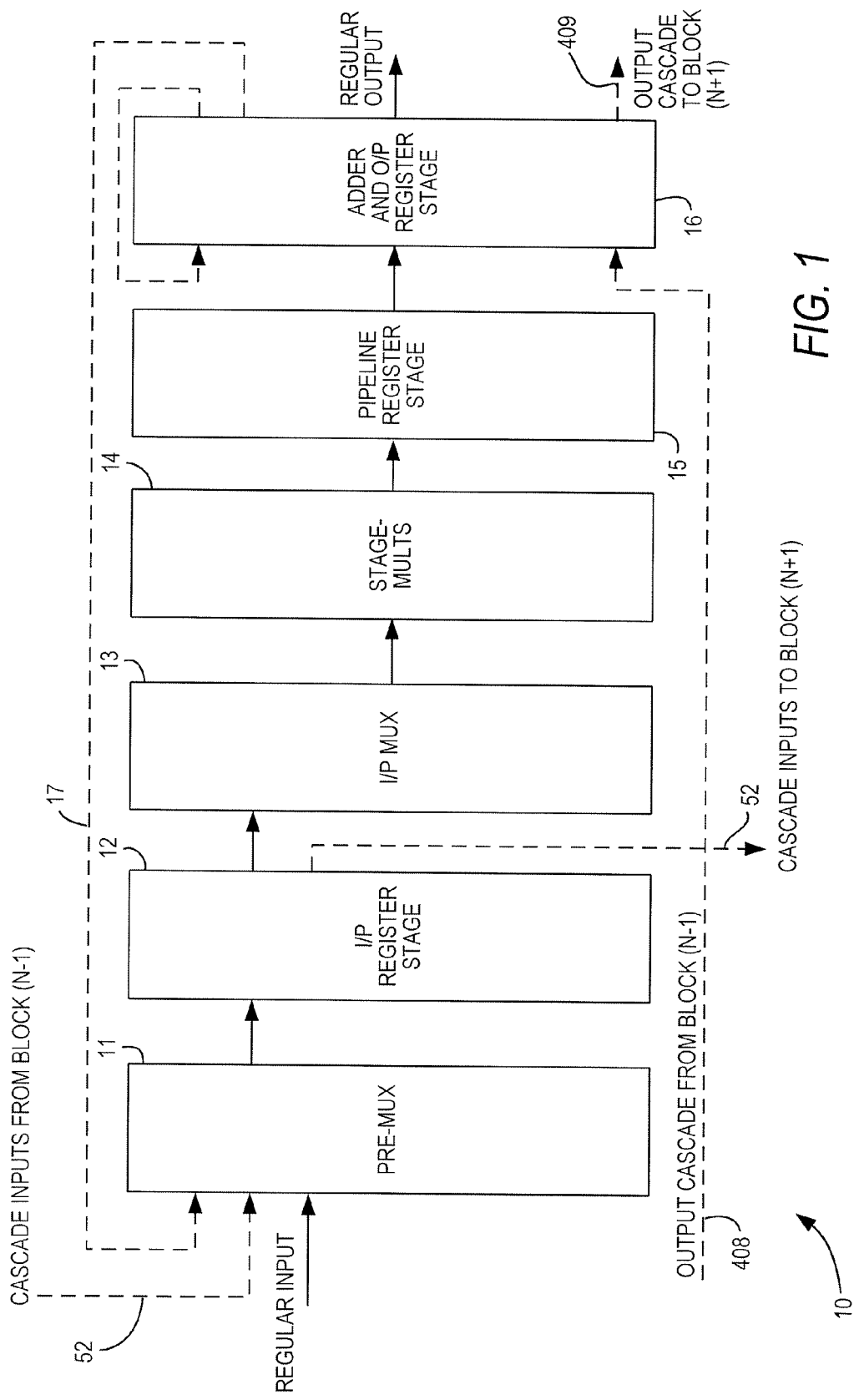
FIG. 1 is a high-level diagram of one preferred embodiment of a specialized processing block in accordance with the present invention.

Floating point numbers are common place for representing real numbers in scientific notation in computing systems. Examples of real numbers in scientific notation are:

$3.14159265_{10}$ ($\pi$)

$2.718281828_{10}$ (e)

$0.000000001_{10}$ or $1.0 \times 10^{-9}$ (seconds in a nanosecond)

$3155760000_{10}$ or $3.15576 \times 10^{9}$ (seconds in a century)

The first two examples are real numbers in the range of the lower integers, the third example represents a very small fraction, and the example represents a very large integer. Floating point numbers in computing systems are designed to cover the large numeric range and diverse precision requirements shown in these examples. Fixed point number systems have a very limited window of representation which prevents them from representing very large or very small numbers simultaneously. The position of the notional binary-point in fixed point numbers addresses this numeric range problem to a certain extent but does so at the expense of precision. With a floating point number the window of representation can move, which allows the appropriate amount of precision for the scale of the number.

Floating point representation is generally preferred over fixed point representation in computing systems because it permits an ideal balance of numeric range and precision. However, floating point representation requires more complex implementation compared to fixed point representation.

The IEEE 754 standard is commonly used for floating point numbers. A floating point number includes three different parts: the sign of the number, its exponent and its mantissa. Each of these, parts may be represented by a binary number and, in the IEEE 754 format, have the following bit sizes:

|  | Sign | Exponent | Bias | Mantissa |
|---|---|---|---|---|
| Single Precision 32-Bit | 1 bit [31] | 8 bits [30 ... 23] | −127 | 23 bits [22 ... 00] |
| Double Precision 64-Bit | 1 bit [63] | 11 bits [62 ... 52] | −1023 | 52 bits [51 ... 0] |

The exponent preferably is an unsigned binary number which, for the single precision format, ranges, from 0 to 255. In order to represent a very small number, or a number less than 0, it is necessary to use negative exponents. To achieve this the exponent preferably has a negative bias associated with it. For single-precision numbers, the bias preferably is −127. For example a value of 140 for the exponent actually represents (140−127)=13, and a value of 100 represents (100−127)=−27. For double precision numbers, the exponent bias preferably is −1023.

The mantissa preferably is a normalized number—i.e., it has no leading zeroes and represents the precision component of a floating point number. Because the mantissa is stored in binary format, the leading digit can either be a 0 or a 1, but for a normalized number it will always be a 1. Therefore, in a preferred system where numbers are always normalized, the leading digit need not be stored and can be implied, effectively giving the mantissa one extra bit of precision. Therefore, in single precision format, the mantissa preferably includes 24 bits of precision.

A floating point number can be represented in a denormalized state when the exponent cannot be adjusted to accommodate a leading 1 in the mantissa without going out of range. In this case a limited range of denormalized numbers can be supported by allowing the leading 1 to sit in any position within the mantissa. This extends the exponent range by 23 bit positions for single precision numbers and by 52 bit positions for double precision numbers. The following table shows the numeric range for normalized and denormalized floating point numbers:

|  | Denormalized | Normalized | Approx Decimal |
|---|---|---|---|
| Single Precision 32 Bit | $\pm 2^{-149}$ to $(1 - 2^{-23}) \times 2^{-126}$ | $\pm 2^{-126}$ to $(2 - 2^{-23}) \times 2^{127}$ | $\pm 10^{-44.84}$ to $10^{38.53}$ |
| Double Precision 64 Bit | $\pm 2^{-1074}$ to $(1 - 2^{-52}) \times 2^{-1022}$ | $\pm 2^{-1022}$ to $(2 - 2^{-52}) \times 2^{1023}$ | $\pm 10^{-323.3}$ to $10^{308.3}$ |

To represent denormalized numbers in the IEEE 754 format, special codes may be used in the exponent combined with certain conditions in the mantissa. In addition, all of the bits set to 1 or 0 may indicate other types of special values such as signed infinity, zero and Not-A-Number (NAN).

As with real numbers in scientific notation, floating point numbers should have the same exponent before addition (or subtraction) of the mantissas can be performed. The following steps describe the process involved in adding (or subtracting) two floating point numbers:

$A+B=C$, where $A=0.5_{10} B=-0.4375_{10}$

A and B, in non-specific 4-bit mantissa, 8-bit exponent floating point representations are:

$A=+1.000_2 \times 2^{-1} B=-1.110_2 \times 2^{-2}$

First, the exponents of the two numbers are compared. The smaller number's mantissa is shifted to the right until the exponents of the two numbers match. In this case B is the smaller.

$$B=-1.110_2\times2^{-2}>=>-0.111_2\times2^{-1}$$

Second, the mantissas are added:

$$A+B=C=+1.000_2 2^{-1}+(-0.111_2\times2^{-1})$$

$$C=+0.001_2\times2^{-1}$$

Third, the result of the addition is re-normalized by either shifting left and decrementing the exponent, or, by shifting right and incrementing the exponent.

$$C=+0.010_2\times2^{-2}$$

Fourth, one checks to see of the number is normalized. If not, repeat the third step.

$$C=+0.100_2\times2^{-3}$$

$$C=+1.000_2\times2^{-4}$$

Fifth, one checks for any underflows or overflows. If either exists, then an exception/error is flagged. Thus, for example, using IEEE 754 as an example there is no exception/error as the biased exponent equals −4+127=123, which falls within the 8-bit range 0 to 255.

Sixth, the mantissa is rounded to the appropriate number of bits.

$$C=+1.000_2\times2^{-4}$$

The result fits into the 4-bit space as defined and therefore requires no rounding.

Thus, for the addition:

$$A+B=C, \text{where } A=0.5_{10} \text{ and } B=-0.4375_{10}$$

the result is therefore:

$$C=+1.000_2\times2^{-4}=0.0625_{10}$$

For multiplication or division of real numbers in scientific notation, the exponents are added (for multiplication), or subtracted (for division), and the mantissas are multiplied (for multiplication), or divided (for division). The following steps describe the process involved in multiplying two floating point numbers:

$$A\times B=C, \text{where } A=0.5_{10} \text{ and } B=-0.4375_{10}$$

Again, A and B in non-specific, 4-bit mantissa, 8-bit exponent, bias 127, floating point representation are:

$$A=1.000_2\times2^{126} B=-1.110_2\times2^{125}$$

First, the two exponents are added together and the bias is subtracted to obtain the new biased exponent:

$$126+125-127=124$$

Second, the mantissas are multiplied:

$$C=1.000_2\times1.110_2=1.110000_2$$

$$C=1.110000_2\times2^{124}$$

Third, the result of the multiplication is normalized either by shifting left and decrementing the exponent, or by shifting right and incrementing the exponent:

$$C=1.110000_2\times2^{124}$$

Fourth, one checks to see if the third step has resulted in a number that is normalized. If not, the third step is repeated. In this case, the result already is correctly normalized.

Fifth, one checks for any underflows or overflows. If either exists, then an exception/error is flagged. In this case, the exponent after normalization is 124 and therefore is in the 8-bit range 0 to 255. Therefore, no exception/error needs to be flagged.

Sixth, the mantissa is rounded to the appropriate number of bits:

$$C=1.110000_2\times2^{124}$$

The result from multiplying two 4-bit mantissas is an 8-bit result so the most significant 4 bits are taken and any rounding is based on the status of the fifth bit. In this case no rounding needs to be applied:

$$C=1.110_2\times2^{124}$$

Seventh, the sign bit of the result is set to positive if the sign bits of the input numbers are identical, otherwise the sign bit of the result is set to negative. In this case, the signs of the two input values were different so the resulting sign is negative:

$$C=-1.110_2\times2^{124}$$

Thus, for the multiplication:

$$A\times B=C, \text{where } A=0.5_{10} \text{ and } B=-0.4375_{10}$$

the result is therefore:

$$C=-1.110_2\times2^{124}=-0.21875_{10}$$

The following describes IEEE 754 32-bit single precision multiplication without denormalized number support:

| | | Field Bit Width | | | | | | |
|---|---|---|---|---|---|---|---|---|
| | | Exponent | | | Hidden | Mantissa | | Total Word Length |
| Precision | Sign | Min | Max | Bias | Bit | Min | Max | Min | Max |
| Single | 1 | 8 | 8 | +127 | 1 | 23 | 23 | 32 | 32 |
| Extended Single | 1 | $\geq11$ | <Mantissa | Unspecified | 1 | $\geq31$ | Unspecified | 43 | 64 |
| Double | 1 | 11 | 11 | +1023 | 1 | 52 | 52 | 64 | 64 |
| Extended Double | 1 | $\geq15$ | <Mantissa | Unspecified | 1 | $\geq63$ | Unspecified | $\geq79$ | Unspecified |

The standard also supports four rounding modes: round-to-nearest-even (which is the default mode), round-toward-zero (truncation), round-toward-positive-infinity (round up) and round-toward-negative-infinity (round down). In round-to-nearest-even mode, the result is rounded to the nearest integer unless the remainder is exactly one-half, in which case the result is rounded either up or down depending on which result is even.

The invention will now be described with reference to FIGS. 1-7.

Figure 2:
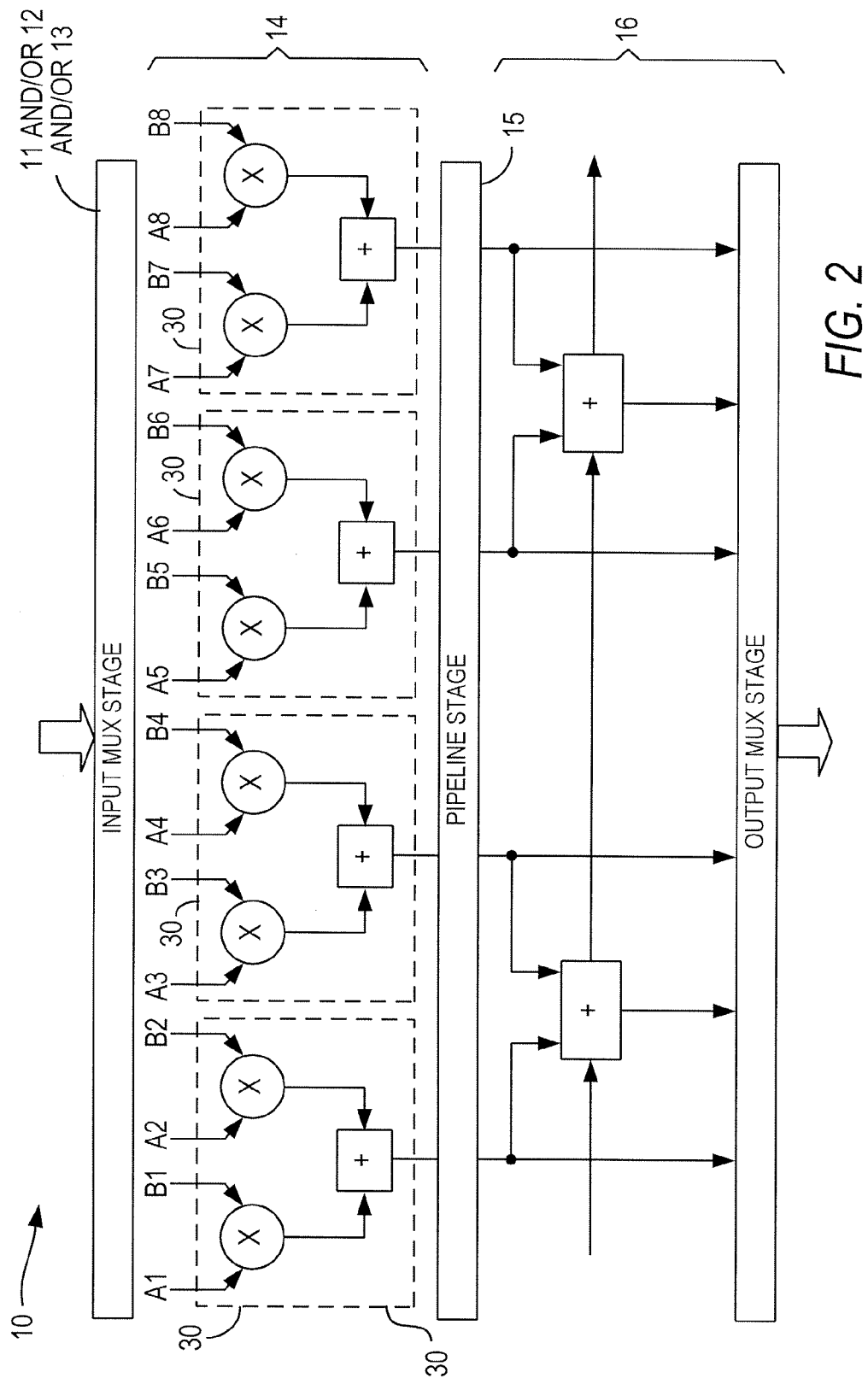
FIG. 2 is a functional diagram of the specialized processing block of FIG. 1.

FIG. 1 shows a high-level diagram of one preferred embodiment 10 of a specialized processing block according to the invention, while FIG. 2 is a functional diagram of the same embodiment 10.

As seen in FIG. 1, specialized processing block 10 includes optional input pre-MUX stage 11, optional input register stage 12, optional input multiplexing stage 13, multiplication stage 14, optional pipeline register stage 15 and adder/output stage 16.

The function of input pre-MUX stage 11, if provided, is to format the regular inputs, loopback inputs and cascade inputs (see below) into a form suitable for registering.

Regular inputs do not require any specific formatting. Cascade inputs may be a one-register delayed version of a previous input, and therefore may need formatting accordingly. However, such formatting also can be done in programmable logic of the programmable logic device of which specialized processing block 10 is a part, so if formatting of cascade inputs is the only pre-MUX function required, input pre-MUX stage 11 can be omitted or, if provided, bypassed. The loopback input 17 may be arranged so that it is always connected to a particular multiplier or group of multipliers. The formatting performed by input pre-MUX stage 11 may include the direction of particular inputs to particular bit locations depending on the function to be performed by specialized processing block 10. The formatting may be carried out in one embodiment according to a stored table identifying the various possible operations (e.g., simple or complex multiplications of various sizes, shifting operations, rotation operations, etc.) and specifying the corresponding formatting required.

The output of input pre-MUX stage 11, if provided, may be registered by optional input register stage 12. If there in no input pre-MUX stage 11, then the input register function, if needed, can be performed in the programmable logic portion of the programmable logic device of which block 10 is a part. Therefore, input register stage 12 is considered optional. Input register stage 12, even if provided, preferably can be optionally bypassed in cases where unregistered outputs are needed or desired.

Input multiplexing stage 13, if provided, takes registered or unregistered inputs from input pre-MUX stage 11 and inputs potentially from elsewhere in the programmable logic device and formats the data for the different operational modes. In that respect it is similar to input pre-MUX stage 11, and therefore frequently if one of input pre-MUX stage 11 and input multiplexing stage 13 is provided, the other will not be provided.

As one example of the type of formatting performed by input pre-MUX stage 11 or input multiplexing stage 13, consider an 18-by-18 complex multiplication in which:

Real Result=$Re[(a+jb)\times(c+jd)]=(ac-bd)$

Imag Result=$Im[(a+jb)\times(c+jd)]=(ad+bc)$

This complex operation requires four 18-by-18 multiplications and hence eight 18-bit inputs, but because there are only four unique 18-bit shared inputs, input multiplexing stage 13 will take the inputs a, b, c and d and perform the necessary duplication so those four inputs are properly routed to the correct multiplier inputs for each of the real and imaginary calculations. Similarly, for 9- and 12-bit mode operations, input pre-MUX stage 11 and/or input multiplexing stage 13 ensures correct alignments of the input bits in order to obtain correct results.

Multiplication stage 14 preferably includes a plurality of fundamental processing units as described above. In a preferred embodiment, each specialized processing block 10 (see FIG. 2) includes four fundamental processing units 30, meaning that it can perform up to eight multiplications in groups of two multiplications that are summed together. In that embodiment, the fundamental processing units in specialized processing block 10 preferably are grouped into identical half-blocks, so that each half-block in its own right can be considered a specialized processing block within the invention.

Each fundamental processing unit preferably includes the functionality for a sum of two 18-by-18 multiplications. The fundamental processing units preferably are all identical, but in some embodiments, it is possible to provide a negation function on only some inputs of some multipliers, as maybe required for, e.g., complex multiplication where, as is apparent above, subtraction may be required. Alternatively, the negation function may be provided in the adder portion of the fundamental processing unit, so that one or more adders can also perform subtraction.

Figure 3:
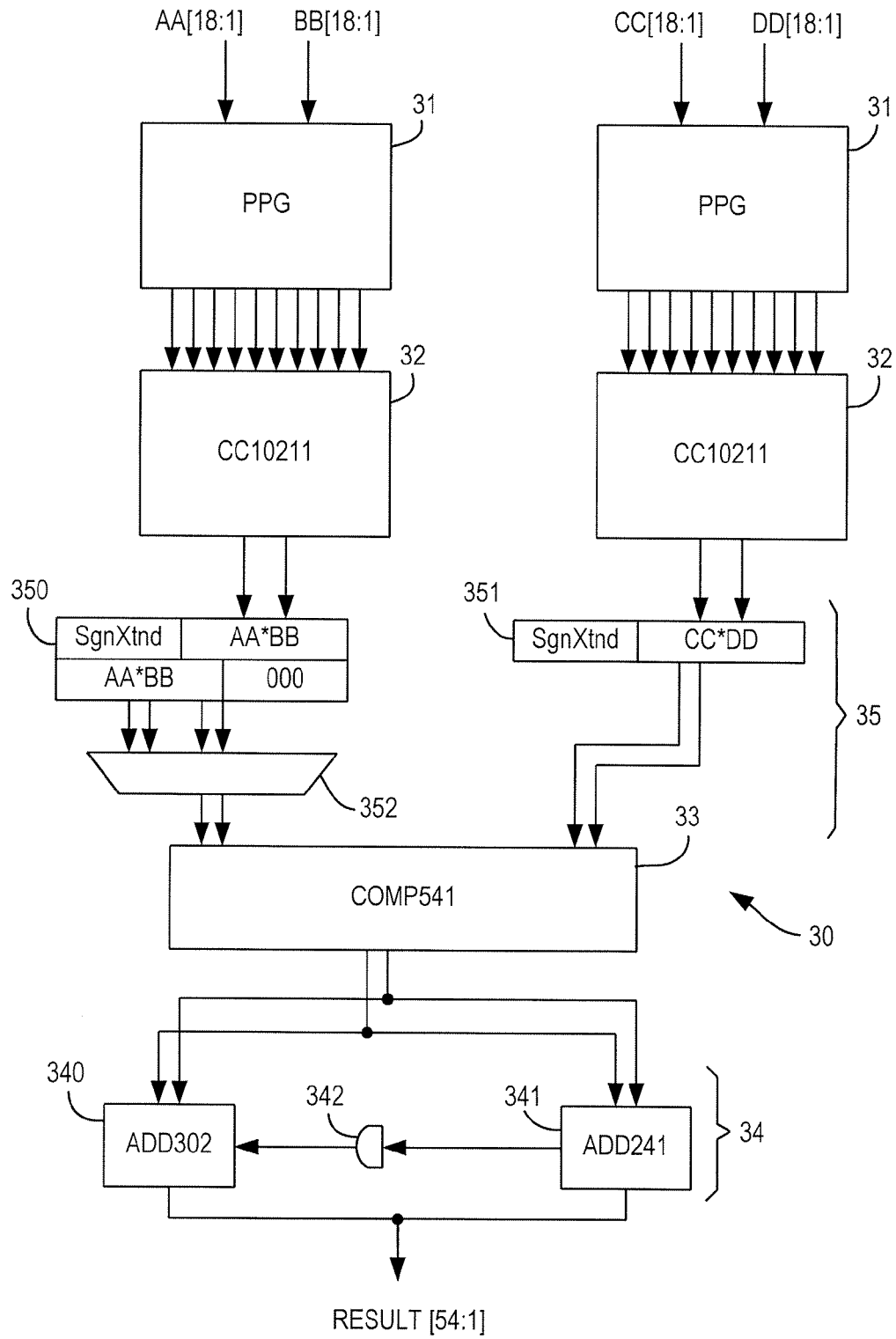
FIG. 3 is a block diagram of a preferred embodiment of a fundamental processing unit for a specialized processing block in accordance with the present invention.

The structure of a preferred embodiment of a fundamental processing unit is shown in FIG. 3. Each fundamental processing unit 30 preferably supports a sum of two 18-by-18 multiplications and preferably includes two partial product generators 31, two ten-vector-to-two-vector compressors 32, a 4-to-2 compressor 33, and two carry-propagate adders 34. Adders 34 preferably include one 30-bit adder 340 and one 24-bit adder 341, which are selectably connectable by a control signal 342. For smaller multiplications such as 9-by-9 or 12-by-12, only 24 bits are required, so the two adders can be disconnected to allow two independent multiplications. For larger multiplications such as 18-by-18, the two adders 34 should be linked as a single adder.

Each partial product generator 31 preferably creates nine 20-bit signed Booth-encoded vectors (Booth-encoding is a known technique that can reduce the number of partial products), as well as a 17-bit unsigned carry vector (negative partial products are in ones-complement format, with the associated carry-in bit in the carry vector). An additional 19-bit signed partial product may be generated in the case of unsigned multipliers (which preferably will always be zero for signed multipliers). Although preferably up to 11 vectors may be generated, the carry bits preferably can be combined with the partial product vectors, requiring only 10 vectors to be compressed.

The partial products preferably are compressed down to two 39-bit vectors (36 bits plus sign extension bits). Any sign extensions should be preserved properly past the 36-bit 18-by-18 multiplier boundary, so that any sign extensions can be valid up to the 72-bit 36-by-36 multiplier boundary (in a case where two fundamental processing units are combined to implement a 36-by-36 multiplication as described below). After compression, the results preferably are processed in mux-and-shift circuitry 35, which preferably include combinatorial logic where any sign-extension, zero-filling or shifting of the results before addition, as may be required depending on the operation being performed, can be accomplished prior to final combination of the results in 4-to-2 compressor 33 and carry-propagate adders 34. For each of circuits 350, 351, the inputs preferably are two 39-bit vectors for a total of 78 input bits, while the outputs preferably are two 54-bit vectors for a total of 108 bits. The extra thirty bits are the result of sign extension, zero-filling, and or shifting. Multiplexer 352 indicates a selection between sign extended or zero-filled results. The four 54-bit vectors are input to compressor 33 which outputs two 54-bit vectors, which are added in adders 34 to produce a 54-bit output.

As discussed above, because the partial products from both multipliers are added at once, the two multipliers of a fundamental processing unit cannot be used for two independent multiplications, but a single multiplication can be carried out by zeroing the inputs of the second multiplier.

For smaller multiplications, independent subset multipliers (9-by-9 and 12-by-12 cases) may be handled as follows:

For two 9-by-9 multiplications, the first 9-by-9 multiplication preferably is calculated using the most significant bits (MSBs) of the first multiplier (on the left in FIG. 3), and the second 9-by-9 multiplication preferably is calculated using the least significant bits (LSBs) of the second multiplier (on the right in FIG. 3). The MSBs of the right multiplier are filled with the sign extensions of the corresponding values, as appropriate. The outputs of the left multiplier (sum and carry vectors) are left-shifted by 18 bits. The two multiplier outputs preferably are then compressed together and the two resulting final vectors are then added with the two adders 34, which are not connected for this operation. The first 9-by-9 result preferably will be output on the MSBs of the left (30-bit) adder 340, while the second 9-by-9 result preferably will be output on the LSBs of the right (24-bit) adder 341.

Independent 12-by-12 multiplications can be calculated in a manner similar to a 9-by-9 multiplication, using the MSB/LSB method.

In both cases, preferably the right multiplier outputs are zeroed above 24 bits to prevent any interference with the independent left multiplier result.

In the case of summed multiplications, regardless of the precision, all inputs preferably are shifted to occupy the MSBs of the multipliers used, and the output vectors preferably are not shifted. The output vectors, however, preferably are fully sign-extended, so that sign-extension out of the adders 34 can be used for the full width of the accumulator (below).

Preferably, for complex multiplications and other operations that require subtraction of products, the adder inputs can be negated (effectively making the adder an adder/subtractor). Alternatively, however, one or more of the multipliers can be provided with the ability to selectively negate its output vectors, by inverting the input (ones' complement), and adding the multiplicand to the result. The multiplicand addition can be performed in the compression of the partial products, so that the negation can be implemented before adders 34.

Pipeline register stage 15, which preferably may be bypassed at the user's option, preferably allows outputs of multiplication stage 14 to be registered prior to further addition or accumulation or other processing.

Figure 4:
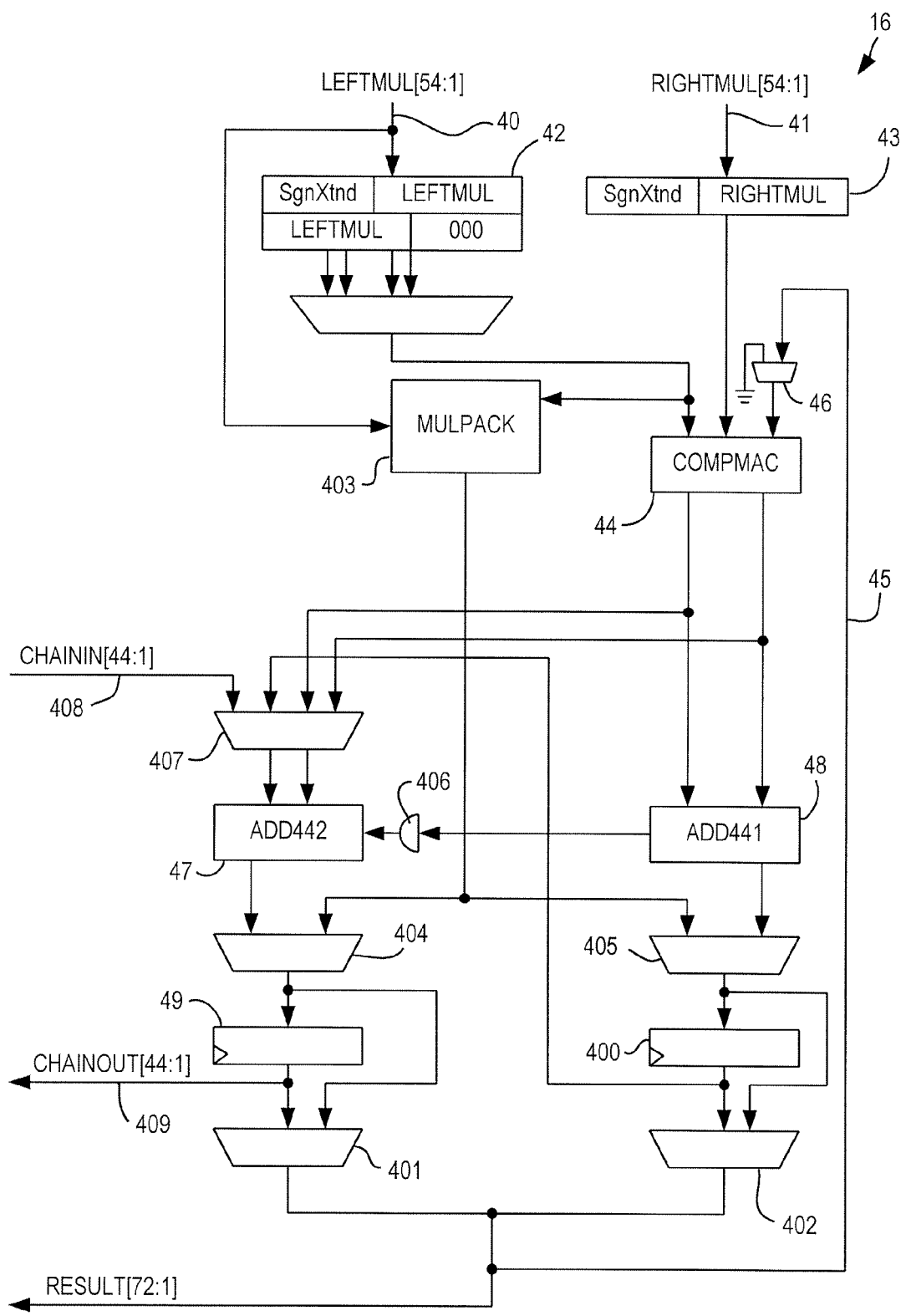
FIG. 4 is a preferred embodiment of an output stage of a specialized processing block in accordance with the present invention

Adder/output stage 16 preferably selectively shifts, adds, accumulates, or registers its inputs, or any combination of the above. Its inputs preferably are the outputs of the two fundamental processing units in specialized processing block 10. As seen in FIG. 4, those two inputs 40, 41 are input to respective register/shifter units 42, 43, which optionally may shift or sign extend inputs 40, 41. In a preferred embodiment, each of inputs 40, 41 is a 54-bit vector, which is shifted or sign-extended to create a respective 72-bit vector.

The outputs of units 42, 43 preferably are input to a 3:2 compressor 44, along, preferably, with the output 45 of stage 16 itself. This feedback provides an accumulation function to specialized processing block 10. Preferably, the fed-back output 45 passes through multiplexer 46, which can alternatively select a zero (e.g., ground) input when accumulation is not necessary or desired.

The outputs of compressor 44 are provided (through appropriate multiplexers as described below) to two adders 47, 48, which may be chained together under programmable control, depending on the use to which they are to be put, as described below. The outputs of adders 47, 48 preferably may be registered in registers 49, 400 or not, as determined by multiplexers 401, 402. Registered or not, outputs 47, 48 preferably make up the output vector of specialized processing block 10. As an alternative path, multiplexers 403, 404, 405 allow adders 47, 48 to be bypassed where the outputs of fundamental processing units 30 are to be output without further processing.

In the case, described above, where each fundamental processing unit 30 can perform a sum of two 18-by-18 multiplications, two fundamental processing units 30 can perform a 36-by-36 multiplication, which, as is well known, can be decomposed into four 18-by-18 multiplications. In such a case, two compressed 72-bit vectors preferably are output by compressor 44 and preferably are added together by the two 44-bit adders 47, 48, which are programmably connected together for this mode by AND gate 406. The upper 16 bits may be ignored in this mode.

In other modes with narrower outputs, where adders 47, 48 need not be connected together, adders 47, 48 optionally may be arranged to chain the output of specialized processing block 10 with the similar output of another specialized processing block 10. To facilitate such a mode, the output of register 400, for example, may be fed back to 4:2 multiplexer 407, which provides two inputs to adder 47. The other inputs to multiplexer 407 may be the two vectors output by compressor 44 and chain-in input 408 from another specialized processing block 10, which may be provided via chain-out output 409 from register 49 of that other specialized processing block 10.

Thus, in chaining mode, 44-bit adder 48 may be used to add together the results within one of specialized processing blocks 10—configured, e.g., as a single multiplier, a sum of multipliers, or an accumulator—with the results of the previous block. By using multiplexer 407 to select as inputs to adder 47 the output of adder 48 and the output of another specialized processing block 10, the output of the current specialized processing block 10 can be the chained sum of the outputs of the current and previous specialized processing blocks 10. If the chaining mode is used, only a 44-bit accumulator is available, which will still give a 6-bit to 8-bit guard band, depending on the number of multipliers. However, as is apparent, the chaining mode is not available for the 36-bit mode, in which both adders 47, 48 are needed to obtain the result of a single specialized processing block 10.

The output paths may be slightly different depending on the mode of operation. Thus, multiplexers 401, 402 allow selection of registered or unregistered outputs of adders 47, 48. It will be appreciated, however, that, as shown, registered outputs preferably are used in cascade or chained mode.

In addition, at least one output may be looped back, as at 17, to an input of specialized processing block 10. Such a loopback feature may be used, for example, if specialized processing block 10 is programmably configured for adaptive filtering. Although multiple loopbacks may be provided, in a preferred embodiment, one loopback 17 to single multiplier or group of multipliers is provided.

Figure 5:
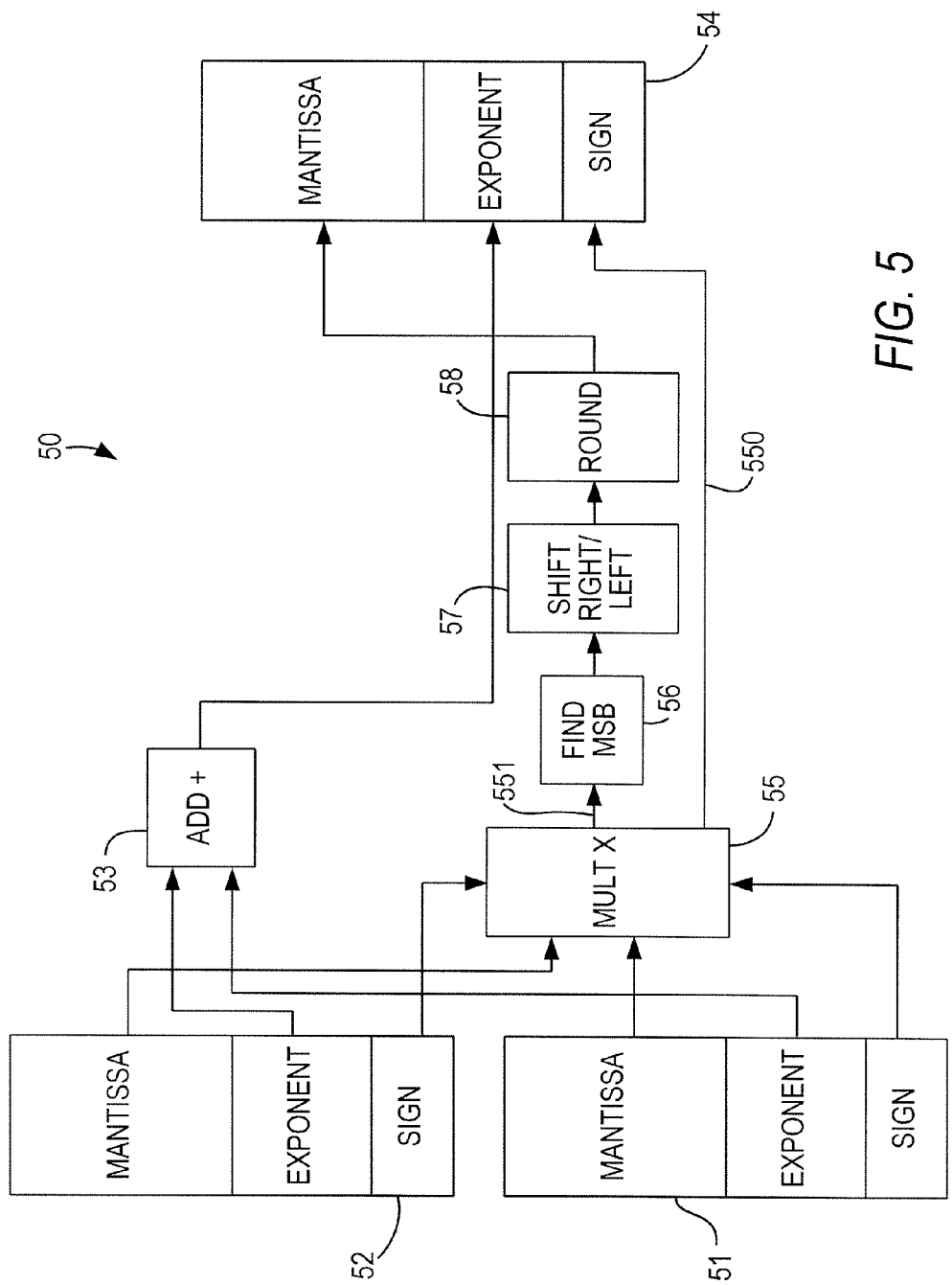
FIG. 5 is a functional diagram of a portion of a specialized processing block in accordance with the present invention configured to perform floating point operations.

A high level block diagram of a single-precision floating point computation 50 is shown in FIG. 5. The computation can be broken down into the following operations:

$$A \times 2^m \times B \times 2^n = (A \times B) \times 2^{(m+n)}$$

Representing A×B as X, one can write the result as:

$$X \times 2^{(m+n)}$$

where
- (a) X={Sign_X,Exp_X,Fraction_X}
- (b) Sign_X=Sign_A (XOR) Sign_B
- (c) Fraction_X=ROUND(NORMAL(Fraction_A×Fraction_B))
- (d) Exp_X=SAT(Exp_A+Exp_B−127+Extra_bit from Fraction_X computation) (See below)

It is apparent that computation steps (a) and (b), as well as the addition of n to m for the exponent, are trivial. Steps (c) and (d) are more complex.

In particular, step (c) involves effectively a positive 24-bit-by-24-bit multiplication of the fractional representation, where each multiplicand is a 23-bit fractional portion or mantissa, prefaced by a leading 1 (see above). Such a 24-by-24 multiplication can be accommodated in specialized processing block 10 using the 36-by-36 multiplier mode. As seen in step (c), however, the multiplication is followed by normalization and rounding, as described below. Similarly, the exponent must be clipped by a saturation function to prevent overflow or underflow, as described in more detail in copending, commonly-assigned U.S. patent application Ser. No. 11/447,329, filed concurrently herewith, and hereby incorporated by reference herein in its entirety.

In the simplified view of FIG. 5, the exponents of inputs 51, 52 are added at 53 to provide the exponent of output 54. The sign and mantissa bits are input to multiplier 55. One output 550 of multiplier 55 provides the sign of output 54. Another output 551 of multiplier 55 is processed at 56 to identify its most significant bit. The output is then shifted at 57 to normalize it as necessary, and it is then rounded at 58 to provide the mantissa of output 54.

Figure 6:
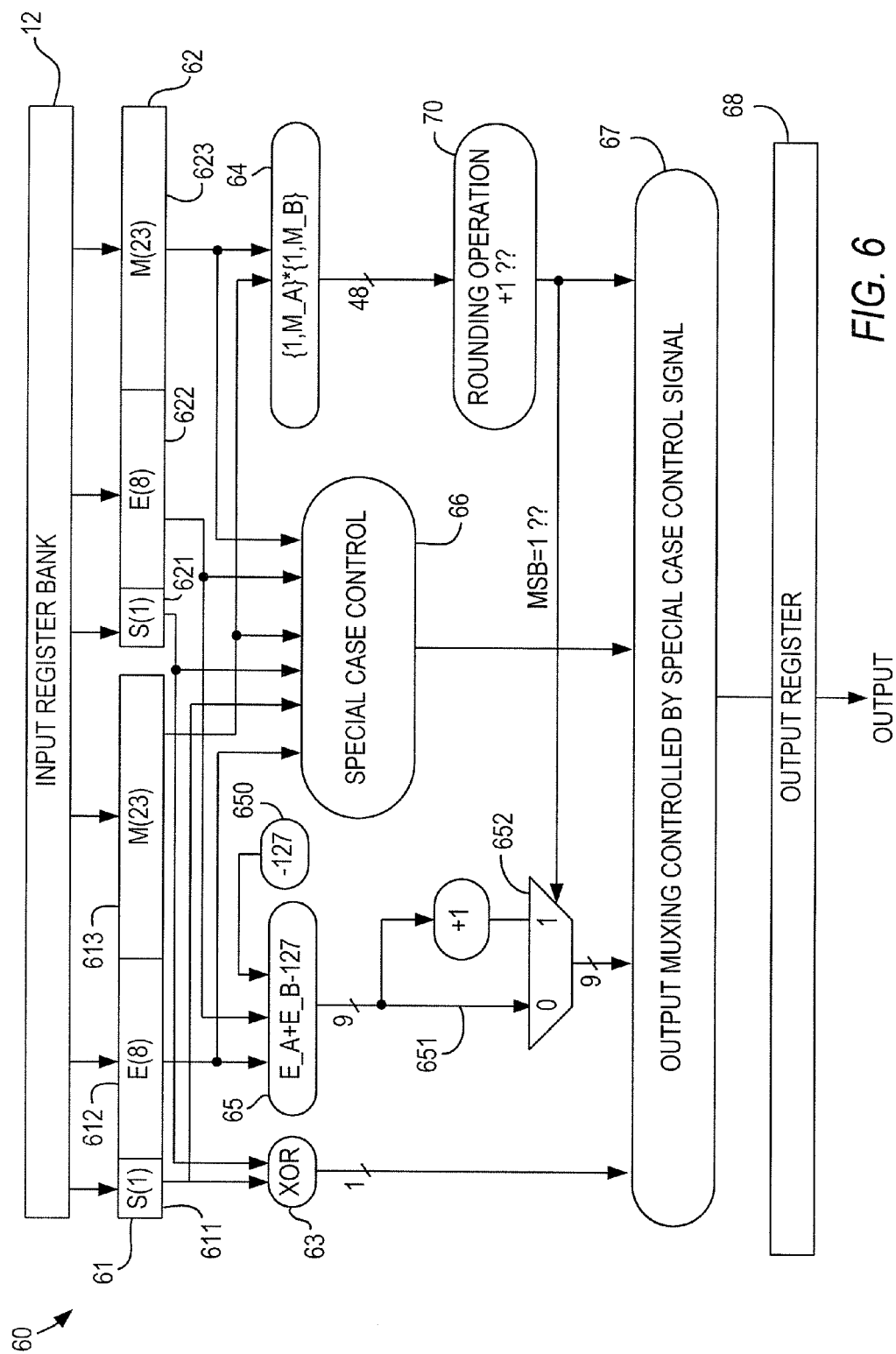
FIG. 6 is a diagram of floating point logic in accordance with the present invention.

FIG. 6 shows the actual logic, which is more complex. In logic 60, the multiplicands are input via input register stage 12 to registers 61, 62. Each register 61, 62 preferably is 32 bits wide, including one bit for the sign, eight bits for the exponent and 23 bits for the mantissa. The two sign bits 611, 621 preferably are input to XOR 63 to compute the output sign. At 64, each of the two 23-bit mantissas 613, 623 is concatenated with a 1 and the resulting two 24-bit numbers are multiplied by the 36-by-36 multiplier of specialized processing block 10 (with appropriate padding to 36 bits). At 65, the two 8-bit exponents 612, 622, are added together along with bias value 650, which as shown is −127 (for a single-precision operation), but which could be −1023 or some other value, as described above. All of the sign, exponent and mantissa bits 611, 621, 612, 622, 613, 623 are also input into special case control circuitry 66, which decides whether or not the inputs are NAN, denormalized numbers, zeros or infinity, and controls output multiplexer 67 as described below.

The output of mantissa multiplication 64 is normalized and rounded at 70, described in more detail below. The output 651 of exponent calculation 65 is directed to multiplexer 652, where either output 651, or output 651 incremented by 1 (this is the "extra bit" referred to above), is selected depending on the output of rounding operation 70, as described below. All of the values are then input to output multiplexer 67 to provide the final output to output register 68. Output multiplexer 67 is controlled by special case control 66, which determines whether the result ought to be NAN, 0, or positive or negative infinity, based on whether any of the multiplicands is NAN, 0, or positive or negative infinity, and otherwise causes output multiplexer 67 to output the calculated multiplication result.

Figure 7:
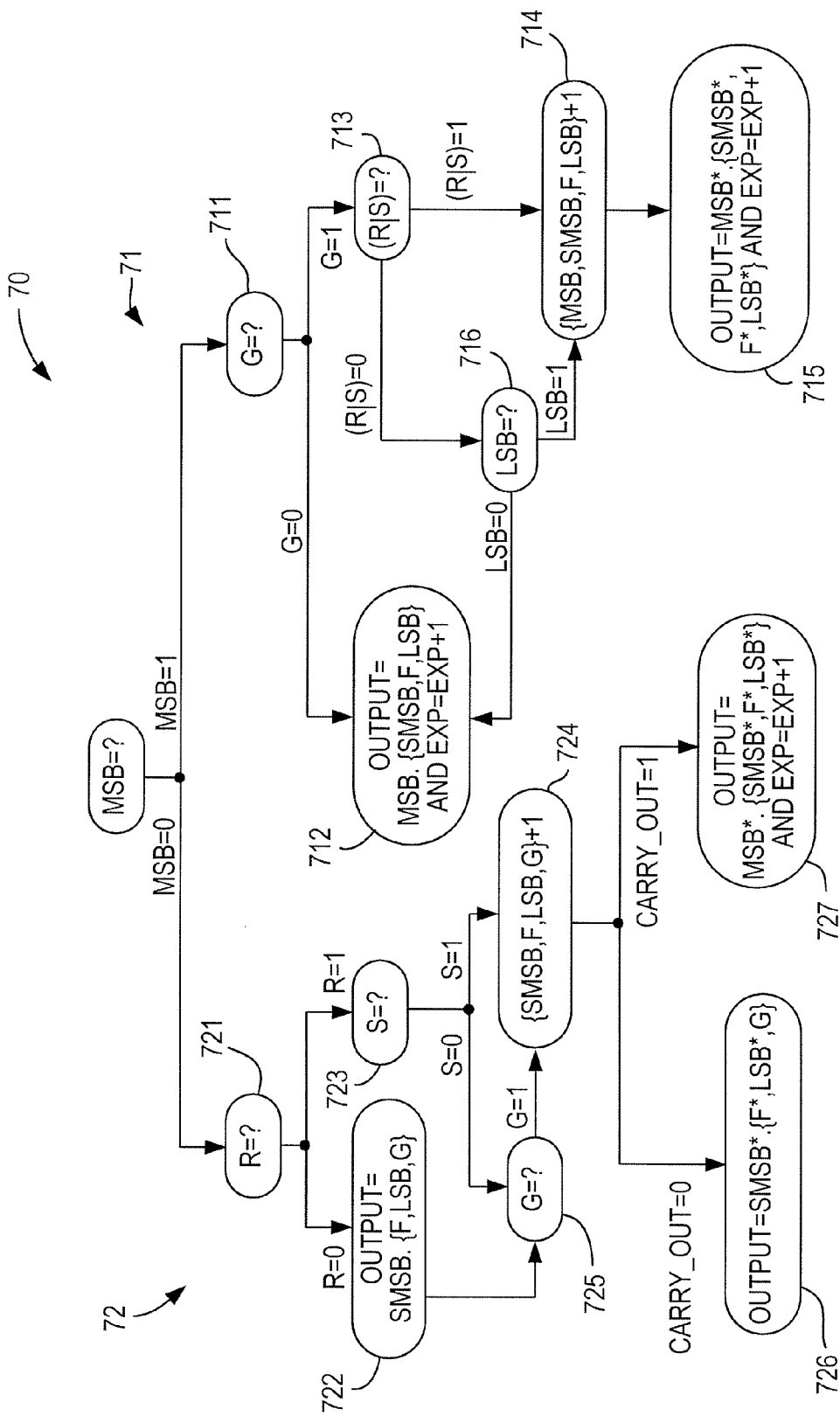
FIG. 7 is a schematic diagram of rounding and normalization logic in accordance with the present invention.

A preferred embodiment of normalization and rounding logic 70, which can be implemented as a state machine using a collection of gates, is shown in detail in FIG. 7. Logic 70 operates on the 48-bit output of mantissa multiplication 64 In FIG. 7, MSB represents the most significant bit of the 48 bits, SMSB represents the second most significant bit, F represents the following 21 bits, LSB represents the bit after F which will be the least significant bit of the output (unless rounded), G and R represent the next two bits, and S represents the final 22 bits. Each of those variables when followed by an asterisk represents the corresponding value after rounding.

The right-hand branch 71 of logic 70 represents the case where MSB=1, and therefore no normalization is required. The output is simply rounded by first testing, at 711, the value of G, the bit after LSB. If, at 711, G=0, then {G,R,S}<$0.5_{10}$ and no rounding is necessary, and the output 712 is MSB. {SMSB,F,LSB} and the exponent is incremented by 1 (via multiplexer 652). If, at 711, G=1, then whether rounding is required depends on whether, at 713, {R,S}=0. If, at 713, (R,S)≠0, then {G,R,S}>$0.5_{10}$ and rounding up is required, as at 714, and the output at 715 is MSB*. {SMSB*,F*,LSB*} and the exponent is incremented by 1 (via multiplexer 652). If, at 713, (R,S)=0, then (G,R,S)=$0.5_{10}$ and whether rounding up is required depends (in the preferred round-to-nearest-even embodiment) on whether LSB=0 or LSB=1, as determined at 716. If LSB=0, then the nearest even is below, and the output at 712 is MSB. {SMSB,F,LSB} and the exponent is incremented by 1 (via multiplexer 652). If LSB=1, then the nearest even is above, and the output at 715 is MSB*. {SMSB*,F*,LSB*} and the exponent is incremented by 1 (via multiplexer 652).

The left-hand branch 72 of logic 70 represents the case where MSB=0, and therefore normalization is required in addition to rounding. Here, the initial assumption is that everything will be shifted left one bit for normalization, and therefore, initially, SMSB takes on the role of MSB, G takes on the role of LSB, and R takes on the role of G.

If, at 721, R=0, then {R,S}<$0.5_{10}$ and no rounding is necessary, and the output 722 is SMSB. {F,LSB,G}. Here the exponent is not incremented because of the left-shift. If, at 721, R=1, then whether rounding is required depends on whether, at 723, S=0. If, at 723, S≠0, then {R,S}>$0.5_{10}$ and rounding up is required, as at 724. If, at 723, S=0, then {R,S}=$0.5_{10}$ and whether rounding up is required depends (in the preferred round-to-nearest-even embodiment) on whether G=0 or G=1, as determined at 725. If G=0, then the nearest even is below, and the output at 722 is SMSB. {F,LSB,G}. If G=1, then the nearest even is above, and the output is rounded up at 724. In all cases where the output is rounded up at 724, a further choice depends on whether CARRY_OUT=0 or CARRY_OUT=1. If CARRY_OUT=0, meaning there was no overflow in the rounding up operation 724, then the output at 726 is SMSB*. {F*,LSB*,G*}. If CARRY_OUT=1, meaning there was an overflow in the rounding up operation 724, then the output at 727 is MSB*. {SMSB*,F*,LSB*} and the exponent is incremented by 1 (via multiplexer 652).

The actual circuitry (not shown) for implementing logic 60, 70 would be in addition to the circuitry discussed above in connection with FIGS. 1-4, and could include an 8-bit-wide 3:2 compressor for combining the exponents and the bias. Alternatively, this compressor could be included in the compressor circuitry discussed above, with additional multiplexers as necessary. The logic could also include one 9-bit adder to finalize the exponent and bias comptuation, one 9-bit adder for adding 1 to the exponent, as shown, and one 24-bit adder to add 1 when required for round-to-nearest-even rounding. A wide fan-in OR gate could also be included for generating some of the signals involved in rounding. The special case control could include wide fan-in OR and AND gates to determine whether one of the special cases exists. The output multiplexer could actually be a number of multiplexers equal to the width of the widest output, with each multiplexer having a number of inputs equal to the number of possible special case outputs plus 1 (for the calculated output). Thus, there could be 32 6:1 multiplexers, in an implementation where the output could be up to 32 bits wide and there are five special cases; each multiplexer selects one bit position.

Provision of floating point circuitry in a specialized processing block 10 increases efficiency as compared to performing floating point operations in programmable logic outside specialized processing block 10. As a comparison, to perform a 32-by-32 floating point multiplication as described above completely in programmable logic would require 1,053 arithmetic look-up tables (ALUTs). To perform the same operation with a specialized processing block as described but without the floating point unit would require 429 ALUTs plus the specialized processing block which is equivalent to 55 ALUTs, for a total equivalent of 484 ALUTs. To perform the operation with the specialized processing block including the floating point unit would require only a portion of the specialized processing block equivalent to 44 ALUTs.

Thus it is seen that a specialized processing block for a programmable logic device has been provided, which includes a floating point arithmetic unit.

Figure 8:
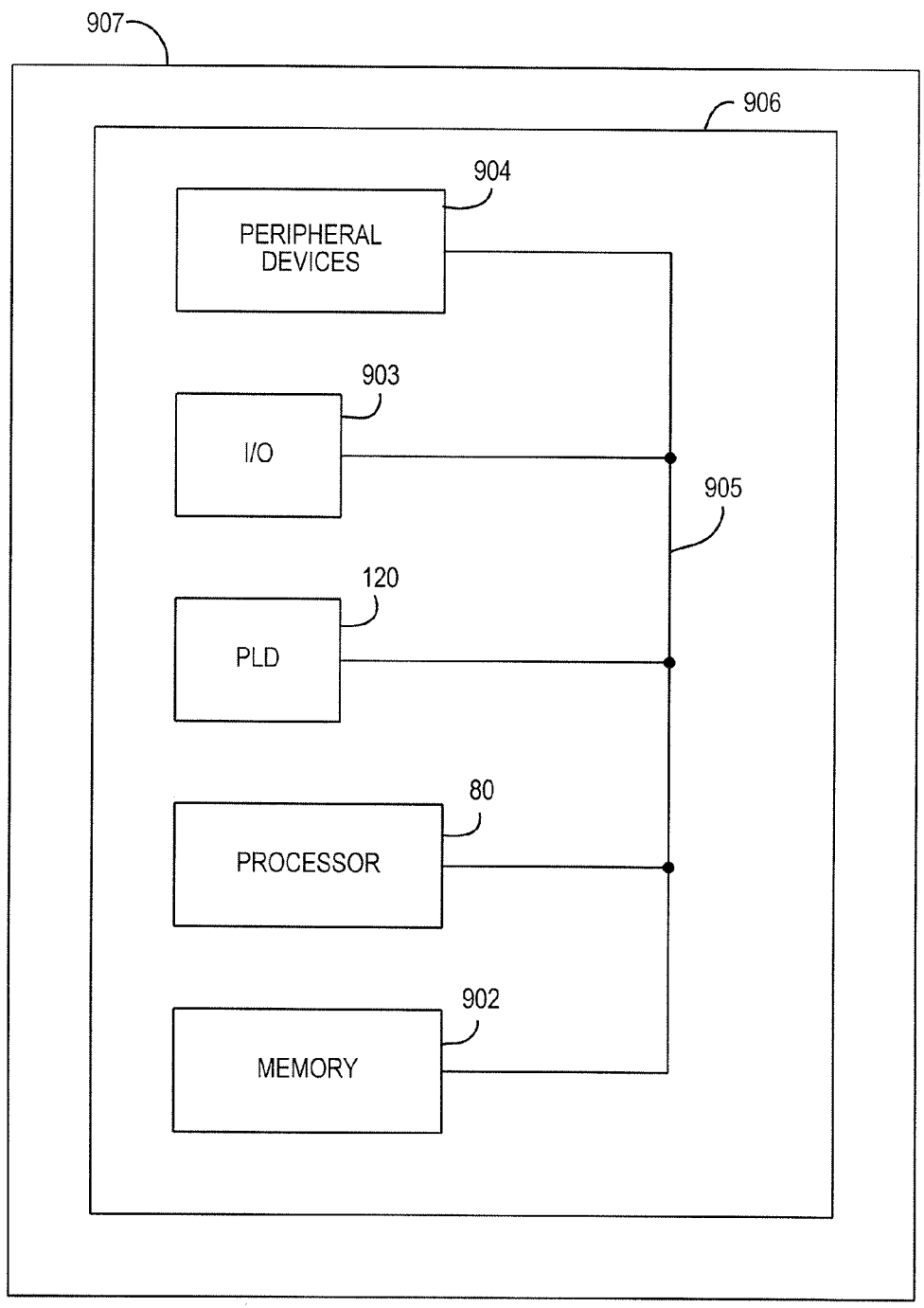
FIG. 8 is a simplified block diagram of an illustrative system employing a programmable logic device incorporating the present invention.

A PLD 80 incorporating such circuitry according to the present invention may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 80 can be used to perform a variety of different logic functions. For example, PLD 80 can be configured as a processor or controller that works in cooperation with processor 901. PLD 80 may also be used as an arbiter for arbitrating access to a shared resources in system 900. In yet another example, PLD 80 can be configured as an interface between processor 901 and one of the other components in system 900. It should be noted that system 900 is only exemplary, and that the true scope and spirit of the invention should be indicated by the following claims.

Various technologies can be used to implement PLDs 80 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A specialized processing block for a programmable logic device, said specialized processing block comprising:
arithmetic circuitry programmable to provide products of inputs and sums of said products to output a result, said arithmetic circuitry comprising a plurality of fundamental processing units, each of said fundamental processing units including:
a plurality of partial product generators, each respective one of said partial product generators having a respective pair of inputs different from inputs of each other one of said partial product generators and providing a respective plurality of vectors representing a respective partial product,
compressor circuitry that compresses each respective plurality of vectors into a smaller number of vectors representing said respective partial product, and
circuitry for adding, in one operation, partial products represented by said smaller number of vectors produced by all of said plurality of partial product generators, each said respective partial product being unroutable to any output of said specialized processing block, thereby being unavailable for output, except after being added, by said circuitry for adding, to other of said respective partial products; said arithmetic circuitry further comprising:
floating point circuitry that separately processes sign, exponent and mantissa for carrying out floating point operations, and
combined rounding and normalization circuitry for processing said mantissa and said exponent; and
special case control circuitry that controls output of said floating point circuitry; wherein:
said special case control circuitry comprises:
multiplexer circuitry having inputs representative of said processed sign, said processed exponent, said processed mantissa, and output of said rounding and normalization circuitry; and
circuitry that examines input sign, exponent and mantissa for special cases and controls said multiplexer to output one of (a) an output of said floating point circuitry and (b) a special case output.

2. A programmable logic device comprising the specialized processing block of claim 1.

3. A digital processing system comprising:
processing circuitry;
a memory coupled to said processing circuitry; and
a programmable logic device as defined in claim 2 coupled to the processing circuitry and the memory.

4. A printed circuit board on which is mounted a programmable logic device as defined in claim 2.

5. The printed circuit board defined in claim 4 further comprising:
memory circuitry mounted on the printed circuit board and coupled to the programmable logic device.

6. The printed circuit board defined in claim 5 further comprising:
processing circuitry mounted on the printed circuit board and coupled to the memory circuitry.

7. An integrated circuit device comprising the specialized processing block of claim 1.

8. A digital processing system comprising:
processing circuitry;
a memory coupled to said processing circuitry; and
an integrated circuit device as defined in claim 7 coupled to the processing circuitry and the memory.

9. A printed circuit board on which is mounted an integrated circuit device as defined in claim 7.

10. The printed circuit board defined in claim 9 further comprising:

memory circuitry mounted on the printed circuit board and coupled to the programmable logic device.

11. The printed circuit board defined in claim 10 further comprising:

processing circuitry mounted on the printed circuit board and coupled to the memory circuitry.

* * * * *